United States Patent
Lee et al.

(10) Patent No.: US 8,417,875 B2
(45) Date of Patent: Apr. 9, 2013

(54) NON-VOLATILE MEMORY CONTROLLER PROCESSING NEW REQUEST BEFORE COMPLETING CURRENT OPERATION, SYSTEM INCLUDING SAME, AND METHOD

(75) Inventors: Change-Hee Lee, Hwasung-si (KR); Jung Been Im, Hwasung-si (KR); Jung-Yeon Yoon, Hwasung-si (KR); Young-Goo Ko, Anyang-si (KR); Dong Hyun Song, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 363 days.

(21) Appl. No.: 12/760,717

(22) Filed: Apr. 15, 2010

(65) Prior Publication Data
US 2010/0268871 A1  Oct. 21, 2010

(30) Foreign Application Priority Data
Apr. 15, 2009  (KR) ................... 10-2009-0032882

(51) Int. Cl.
*G06F 12/00* (2006.01)
(52) U.S. Cl. ................ 711/103; 711/117; 711/E12.008; 711/E12.016
(58) Field of Classification Search .................. None
See application file for complete search history.

(56) References Cited

U.S. PATENT DOCUMENTS

2008/0052452 A1* 2/2008 Chow et al. ................... 711/103
2010/0082890 A1* 4/2010 Heo et al. ...................... 711/103

FOREIGN PATENT DOCUMENTS

| JP | 2004303238 A | 10/2004 |
|----|--------------|---------|
| KR | 100745163 B1 | 7/2007 |
| KR | 1020070099234 A | 10/2007 |
| KR | 1020080056584 A | 6/2008 |

OTHER PUBLICATIONS

J.-W. Park, S.-H. Park, G.-H. Park, and S.-D. Kim, "An Integrated Mapping Table for Hybrid FTL with Fault-tolerant Address Cache," Electronics Express, IEICE Transactions on, vol.6, No. 7, pp. 368-374, Apr. 2009.*

Jim Handy, The Cache Memory Book, 1998, Academic Press Inc., 2nd ed., pp. 27-28.*

* cited by examiner

Primary Examiner — Edward Dudek, Jr.
Assistant Examiner — Ralph A Verderamo, III
(74) Attorney, Agent, or Firm — Volentine & Whitt, PLLC

(57) ABSTRACT

A non-volatile memory controller, system and method capable of processing a next request as an interrupt before completing a current operation are disclosed. The non-volatile memory system includes a first memory storing meta data loaded from a flash memory; a second memory storing the meta data copied from the first memory; and a flash memory controller copying the meta data from the first memory to the second memory, changing the meta data in the second memory, and then re-copying the changed meta data from the second memory to the first memory during a first-type operation that requires changes in the meta data.

16 Claims, 8 Drawing Sheets

NON-VOLATILE MEMORY CONTROLLER PROCESSING NEW REQUEST BEFORE COMPLETING CURRENT OPERATION, SYSTEM INCLUDING SAME, AND METHOD

CROSS-REFERENCE TO RELATED APPLICATIONS

This application claims priority under 35 U.S.C. §119 to Korean Patent Application No. 10-2009-0032882 filed on Apr. 15, 2009, the subject matter of which is hereby incorporated by reference.

BACKGROUND

The subject inventive concept relates to a non-volatile memory system, and more particularly, to a method of managing flash memory in a memory system using a flash memory controller.

Semiconductor memory devices include volatile and non-volatile devices. Volatile semiconductor memory devices are characterized by fast read/write speeds, but lose stored data in the absence of applied power. In contrast, non-volatile semiconductor memory devices retain stored data in the absence of applied power by generally have slower read/write speeds.

Nonvolatile semiconductor memory devices include phase-change random access memory (PRAM), mask read-only memory (MROM), programmable read-only memory (PROM), erasable programmable read-only memory (EPROM), and electrically erasable programmable read-only memory (EEPROM). With respect to MROM, PROM, and EPROM among these nonvolatile semiconductor memory devices, it is not easy for end users to readily reprogram stored information. On the other hand, EEPROM provides easily used electrical erase/write operations and is thus increasingly used for system programming requirements that need continuous update. EEPROM is also increasingly used to implement auxiliary memory devices. Flash EEPROMs (hereinafter, generically referred to as a flash memory) have very high integration density (i.e., data storage per unit area) as compared with other types of EEPROM and are very advantageous when used to implement large-capacity auxiliary memory devices.

Conventionally, disk storage media has been widely used to implement large-capacity storage devices and remains a cost effective form of data storage. However, disk storage devices are vulnerable to mechanical impact, have limited miniaturization prospects, have low physical reliability because of their constituent moving parts (e.g., motors and arms), and require sophisticated controllers. In contrast, flash memory is more mechanically robust due the lack of moving parts, requires much simpler controllers, and has a much smaller physical size. For these reasons, the flash memory is rapidly replacing disk storage devices in many applications.

As is understood by those skilled in the art, the reading/writing of data in flash memory is usually performed in page size units while the erasing of data is performed in block size units comprising a plurality of pages. Erasing is usually required before the rewriting of data during various update operations. This difference between read/write data size and erase data size is a unique feature to flash memory, as compared with other types of data storage devices. To provide compatibility with existing file systems, therefore, the flow of data to/from flash memory must be managed using special software (or a virtual file system) commonly referred to as a flash translation layer (FTL).

The FTL essentially maps physical blocks of data with corresponding logical blocks, where a logical block is "logically" referred to by a host while a physical block is physically stored in memory. Physical blocks are actually accessed within the flash memory in relation to requested logical block in accordance with a defined mapping technique implemented through the FTL. Thus, the FTL intermediately controls the execution of read/write operations by the flash memory in response to a request from the host. Even without a host request, the FTL may control certain internal operation (e.g., merge operations, wear-leveling operations, etc.) routinely performed by the flash memory.

The host usually sends a command (or "host request") to a flash memory system and then waits for a response without specifically recognizing which operation is currently being performed by the flash memory. Yet, the response speed to a host request sufficiently influences the overall performance capabilities of the larger system incorporating the flash memory system.

It is of course possible that a host request may not be immediately responded to by the flash memory when the host request is received during execution of a current operation. For instance, if a read request is received from a host while data is being written to the flash memory, then the read operation cannot be immediately performed due to resource conflicts, such as unavailable I/O ports, data channels, etc. Only after the current write operation is completed can the read operation be performed by the flash memory and/or corresponding channel. Additionally, a read/write request may not be immediately responded to when a current internal operation (e.g., a merge operation or wear-leveling operation) is being performed by the flash memory.

Unfortunately, any delay in responding to a host request runs the risk of slowing the overall performance of the device or system incorporating the flash memory.

SUMMARY

Certain embodiments of the inventive concept provide non-volatile memory controllers capable of processing a new request before completing a current operation being executed in a flash memory. Embodiments of the inventive concept also provide systems and methods related to such non-volatile memory controllers.

According to some embodiments of the inventive concept, there is provided a non-volatile memory system including a flash memory, a first memory, a second memory, and a flash memory controller. The flash memory may store payload data and meta data. The first memory may store the meta data loaded from the flash memory. The second memory may store the meta data copied from the first memory. A flash memory controller during a first-type operation that requires changes in the meta data, the flash memory controller copies the meta data from the first memory to the second memory, changes the meta data in the second memory, and copies the changed meta data from the second memory to the first memory.

The first memory and the second memory may be different types of memory. The first memory may be dynamic random access memory (DRAM) and the second memory is static random access memory (SRAM). The flash memory controller may further load meta data stored in the flash memory to the first memory when the non-volatile memory system is powered-on and to re-load the meta data stored in the first memory to the flash memory when the non-volatile memory system is powered-off.

The memory controller may further including (a) process a current first-type operation, (b) during processing of the current first-type operation, receive a next request implicating a next operation, (c) determine whether the next operation requires immediate processing, and (d) if the next operation requires immediate processing, pause the current first-type operation, process the next operation as an interrupt, and then upon completion of the next operation resuming the current first-type operation.

The next operation may be a second-type operation not requiring a change to the meta data.

The memory controller upon determining that the next operation does not require immediate processing may further including (e) continue processing of the first-type operation until completed, and then (f) process the next operation.

The first-type operation may be one selected from the group consisting of a write operation, a merge operation, and a wear-leveling operation, and the second-type operation may be a read operation.

According to other embodiments of the present inventive concept, there is provided an electronic system including the above-described non-volatile memory system, and a host configured to communicate with the non-volatile memory system.

According to other embodiments of the present inventive concept, there is provided a method of managing a flash memory in a memory system including the flash memory and a memory controller controlling the flash memory. The method includes loading meta data stored in the flash memory to the first memory upon power-on of the memory system, and during processing of a first-type operation requiring a change to the meta data, (a) copying the meta data from the first memory to the second memory, (b) changing the meta data stored in the second memory, and (c) copying the changed meta data from the second memory back to the first memory.

The second memory may be a different type of memory from the first memory, such that the second memory operates faster than the first memory. The first memory may be dynamic random access memory (DRAM) and the second memory is static random access memory (SRAM). A method of managing a flash memory further includes during the processing of the first-type operation, receiving a request to process a second-type operation not requiring a change to the meta data, and pausing the processing of the first-type operation, processing the second-type operation as an interrupt to completion, and then resuming processing of the first-type operation. A method of managing a flash memory further includes loading the meta data stored in the first memory to the flash memory when the memory system is powered-off.

BRIEF DESCRIPTION OF THE DRAWINGS

The above and other features and advantages of the inventive concept will become more apparent upon consideration of certain embodiments thereof with reference to the attached drawings in which.

DETAILED DESCRIPTION OF THE EMBODIMENTS

The inventive concept will now be described more fully hereinafter with reference to the accompanying drawings. This invention may, however, be embodied in many different forms and should not be construed as being limited to only the illustrated embodiments. Rather, these embodiments are presented as teaching examples. Throughout the written description and drawings, like reference numbers and labels are used to refer to like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
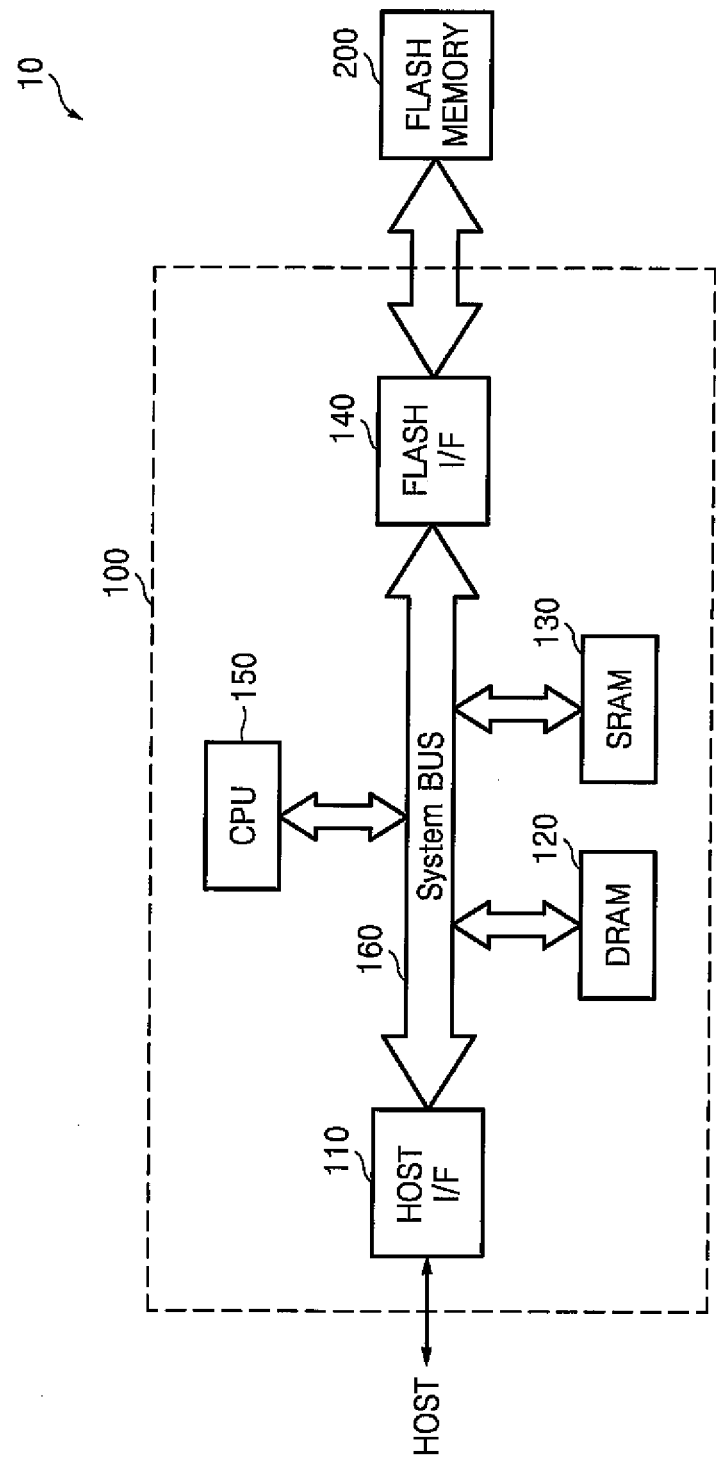
FIG. 1 is a block diagram of a non-volatile memory system according to an embodiment of the inventive concept.

FIG. 1 is a block diagram of a non-volatile memory system 10 according to an embodiment of the inventive concept. The non-volatile memory system 10 generally comprises a non-volatile memory 200 and a memory controller 100 configured to control the non-volatile memory 200. The non-volatile memory 200 is assumed to be flash memory in the illustrated embodiments, but the inventive concept is not restricted thereto.

The flash memory 200 serves as a data storage device storing both user data and meta data. Meta data is not actual data required by the host, but is other or related data, such as data defining an address mapping table including a logical block address (LBA) and a physical block address (PBA) corresponding to the LBA, an erase count for a current physical block, free block information, and bad block information, necessary to identify the state of the flash memory 200 or to efficiently manage the flash memory 200. The meta data may be stored in a so-called "meta block" defined within the flash memory 200. The structure of the flash memory 200 will be described later.

The memory controller 100 controls the overall transfer of data between the host and the flash memory 200. For instance, the memory controller 100 will control the flash memory 200 in compliance with host-generated read/write requests. Thus, the memory controller 100 controls a series of operations, including (e.g.) read, write, and update operations directed to the flash memory 200. The memory controller 100 also controls certain internal operations, such as merge and wear-leveling operations, necessary to efficient management of the flash memory 200.

A merge operation is essentially a process of collecting discontinuously scattered data into a single block within the flash memory 200. The wear-leveling operation is a process of changing the location of a physical block, as indicated by a corresponding logical block, as mapped within the flash memory 200. The memory controller 100 may be programmed with specialty "wear-leveling software" that avoids the over-frequent erasing and writing of data from any particular area of the flash memory 200. This wear leveling control extends the useful life of the flash memory 200. The memory controller 100 using a competent wear-leveling scheme determines whether a particular area of flash memory should receive current write data in order to uniformly distribute data over the entire storage area available in the flash memory 200.

According to one particular wear-leveling scheme, when a write request is received, an erase count for all physical blocks may be scanned. If the erase count for a particular physical block to which the write data is to be stored has reached a predetermined maximum erase count, then the location of the physical block receiving the write data may be changed (i.e., re-mapped) to a different physical block having a lesser erase count based on scan result.

In relation to a merge or wear-leveling operation, the physical-to-logical block mapping information may be changed. As a result, the corresponding meta data must be changed. Also, when write data is written to the flash memory 200, mapping information associated with the logical block and/or the corresponding physical block may change. As a result, the corresponding meta data must be changed. Hereafter, any operation requiring a change in meta data will be referred to as a "first-type operation". In contrast, a "second-type operation" is any operation that does not require a change of meta data.

The memory controller 100 illustrated in FIG. 1 comprises a host interface 110, a central processing unit (CPU) 150, a first memory 120, a second memory 130, and a flash interface 140.

The first memory 120 is used to temporarily store meta data loaded from the flash memory 200. For instance, the memory controller 100 may load meta data from the flash memory 200 to the first memory 120 when the non-volatile memory system 10 is first powered-on. When the non-volatile memory system 10 is powered-off, the memory controller 100 re-loads the current meta data from the first memory 120 back to the flash memory 200. The first memory 120 may also be used as an operation memory for the CPU core 150 and/or as a cache.

The second memory 130 is used to store a copy of the meta data in the first memory 120. The second memory 130 may be implemented using a different type of memory (i.e., a faster operating type of memory) than the type of memory used to implement the first memory 120. For example, the first memory 120 may be implemented using dynamic random access memory (DRAM) and the second memory 130 may be implemented using static random access memory (SRAM), but the inventive concept is not restricted to only these choices.

During a first-type operation requiring change in meta data, the memory controller 100 will copy the meta data stored in the first memory 120 to the second memory 130, change the meta data, and then store the changed meta data back into the first memory 120. The first-type operation may be, for example, a write operation, a merge operation, or a wear-leveling operation.

In a second-type operation, like a read operation, that does not require a change in the meta data, the memory controller 100 will not copy the meta data from the first memory 120 to the second memory 130, but rather will perform the second-type operation referring directly to the meta data stored in the first memory 120.

As is conventionally understood, the host interface 110 functions in relation to a defined data exchange protocol in conjunction with the host connected to the non-volatile memory system 10. On the other end, the flash interface 140 interfaces with the flash memory 200. The CPU 150 performs general control operations necessary to execute operations, such as read/write operations directed to the flash memory 200. Although not shown, it will be apparent to those of ordinary skill in the art that the non-volatile memory system 10 may also include a read-only memory (ROM) storing code data associated with an interface protocol and/or an error detection/correction (ECC) capability.

Figure 2:
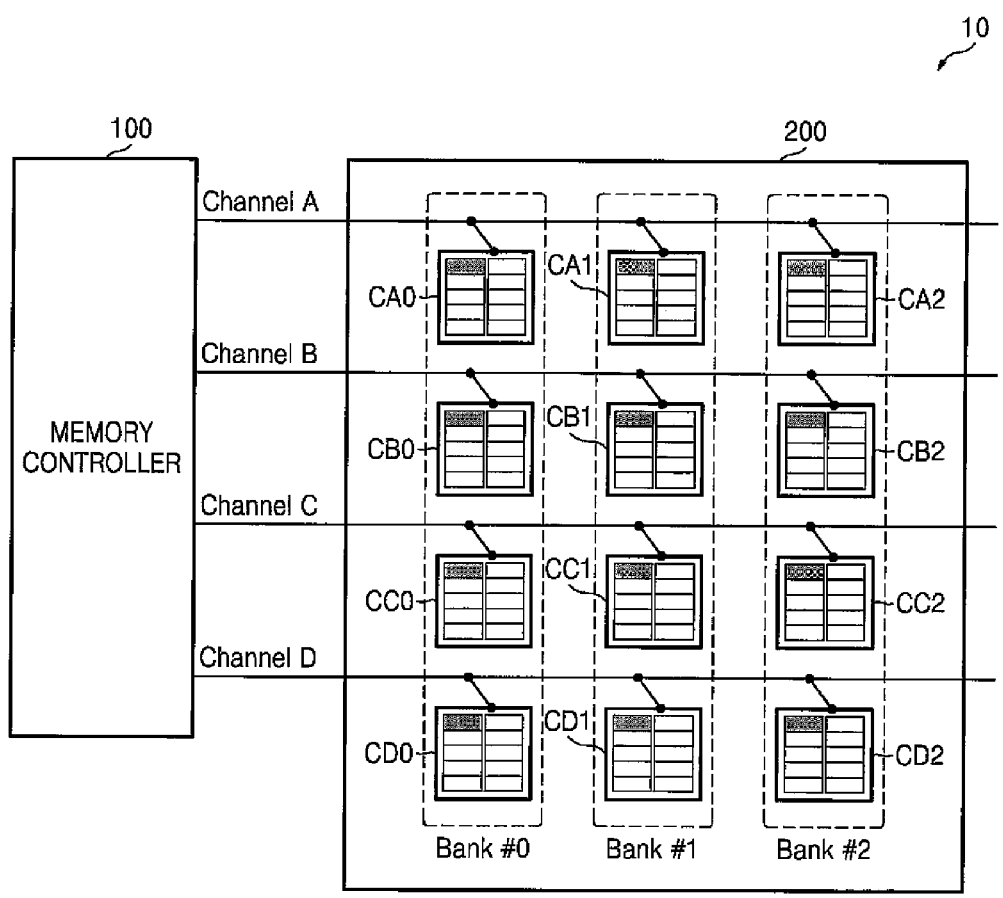
FIG. 2 is a diagram further illustrating one possible structure for the flash memory of FIG. 1.

FIG. 2 is a diagram further illustrating one possible structure for the flash memory 200 of FIG. 1. Referring to FIG. 2, the flash memory 200 is shown as comprising an arrangement of individual flash memory device (a plurality of chips). The flash memory system 10 of FIG. 2 has a hardware structure enabling four (4) channels accessing three (3) banks, but the inventive concept is not restricted to only this configuration. In the flash memory system 10, the memory controller 100 and the flash memory 200 are connected via four (4) channels A, B, C, and D—where each channel is connected to three (3) flash memory chips CA0 through CA2, CB0 through CB2, CC0 through CC2, or CD0 through CD2.

The flash memory system 10 uses a plurality of flash memory chips, as illustrated in FIG. 2, in order to increase storage capacity and data input/output performance. Reading of the flash memory 200 includes reading data from memory cells included in the flash memory 200 and outputting the data from the flash memory 200 to the memory controller 100. Writing of the flash memory 200 includes inputting data from the memory controller 100 to the flash memory 200 and writing the data to memory cells included in the flash memory 200. Accordingly, the memory controller 100 connects a plurality of flash memory chips to a single channel and inputs and outputs data in an interleaving manner.

In the flash memory system 10 using a plurality of chips for high-speed data input/output, as illustrated in FIG. 2, independent meta data exists for each memory chip or each channel. In such a structure, the FTL may issue a different request for each meta data in response to the host's data input/output request. In other words, an independent FTL request may be issued for respective meta data. In a conventional flash memory management, however, when two or more FTL requests are issued in relation to certain meta data, only after the first (current) request is completely processed will the second (next) request be processed. In contrast, certain embodiments of the inventive concept are capable interrupting execution of a "current operation" related to the current request upon receiving a next request, executing a "next operation" related to the next request, and then resuming execution of the current operation. This interrupt/resume approach will be described in some additional detail hereafter.

Figure 3:
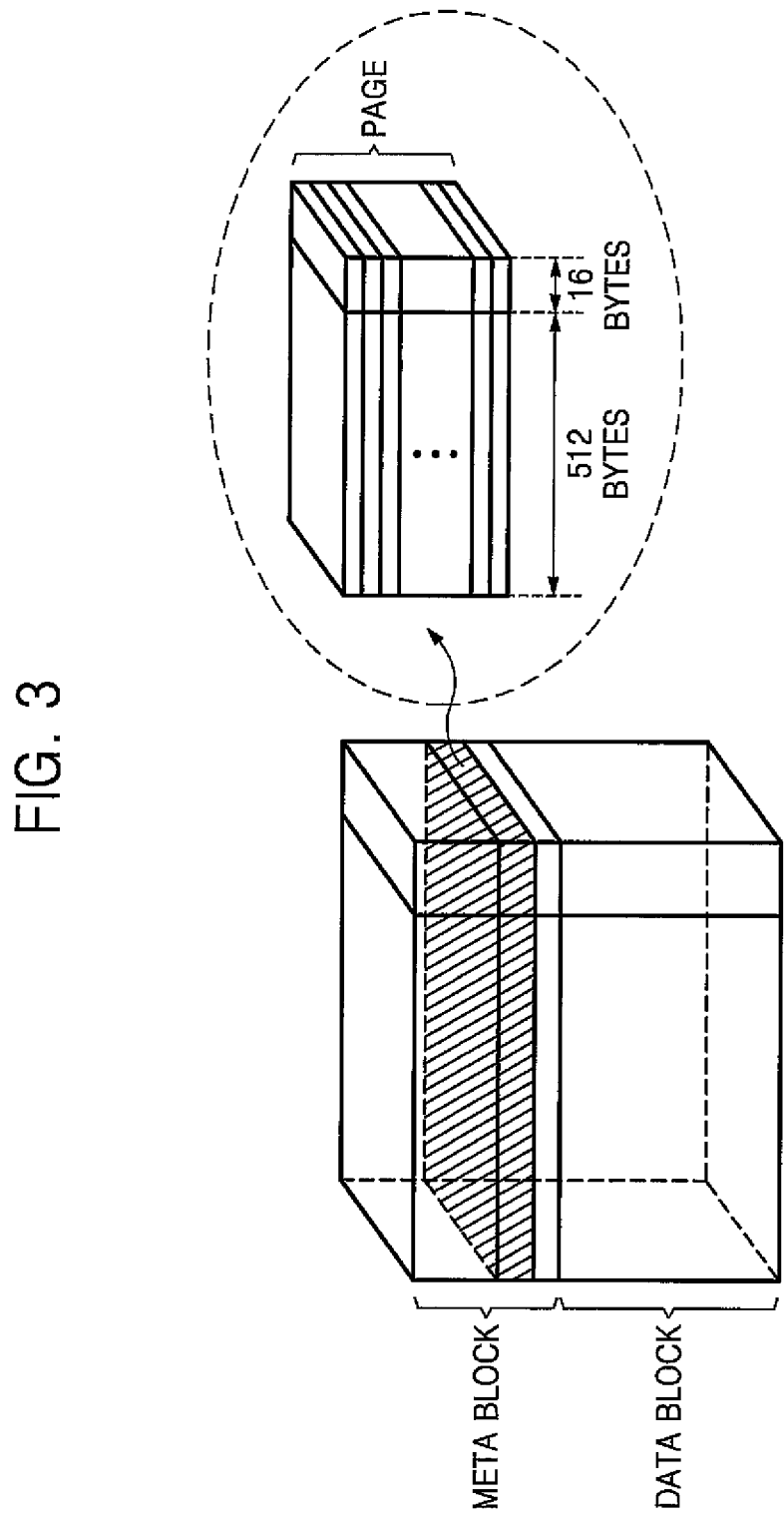
FIG. 3 is a schematic diagram of one possible memory structure for the flash memory chip of FIG. 2.

FIG. 3 is a schematic diagram of one possible memory structure for each flash memory chip CA0 through CD2 shown in FIG. 2. A single flash memory chip, e.g., the flash memory chip CA0, is assumed to include a plurality of (e.g., 1024) physical blocks. Each physical block is divided into a plurality of (e.g., 32) pages and each page includes four sectors. The flash memory chip CA0 erases data in block units and reads/writes data in page units. A single page which is a minimum unit for a read/write operation is divided into a data area of 512 bytes and a spare area of 16 bytes for recording an ECC data. The physical blocks of the flash memory chip CA0 includes a data block and a meta block. The data block is use to store "payload data" (i.e., all non-meta data) and is a logical partition with a predetermined size. The meta block is used to store meta data.

In the embodiments illustrated in FIG. 3, meta data independently exists for each flash memory chip, but the meta data may exist for each channel or each of at least two zones into which the flash memory chip is divided.

Figure 4:
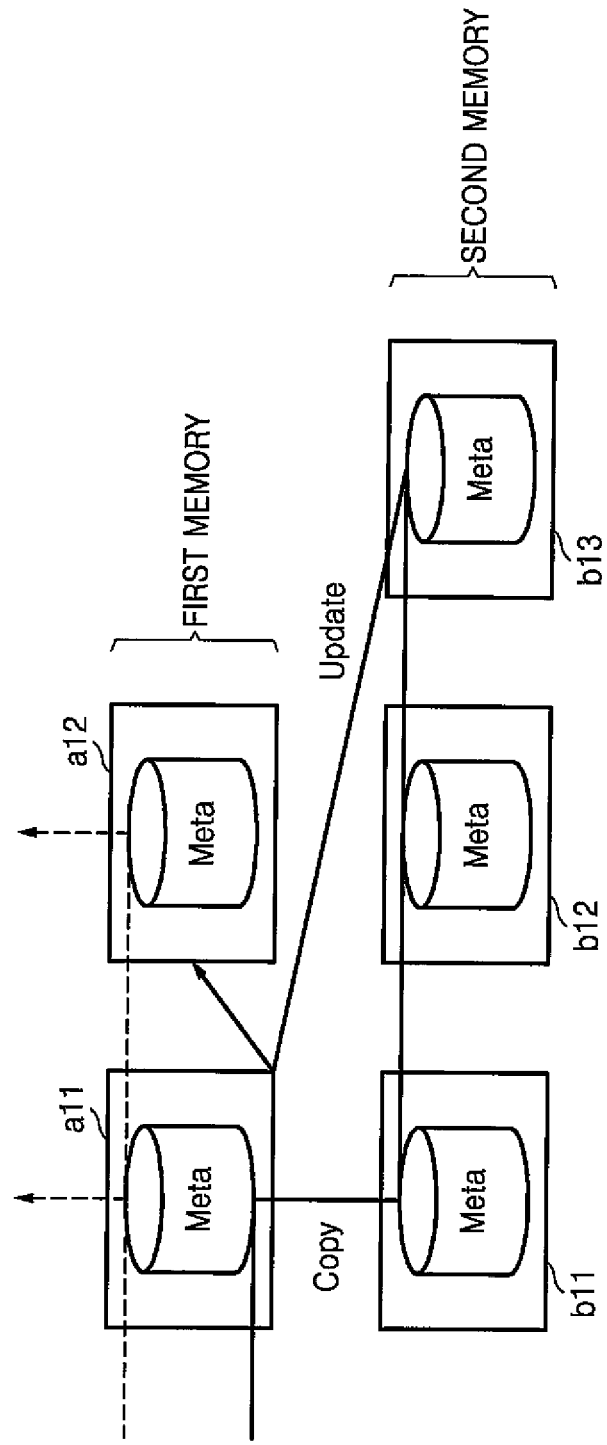
FIG. 4 is a conceptual diagram illustrating a method of managing meta data according to certain embodiments of the inventive concept.
Figure 5:
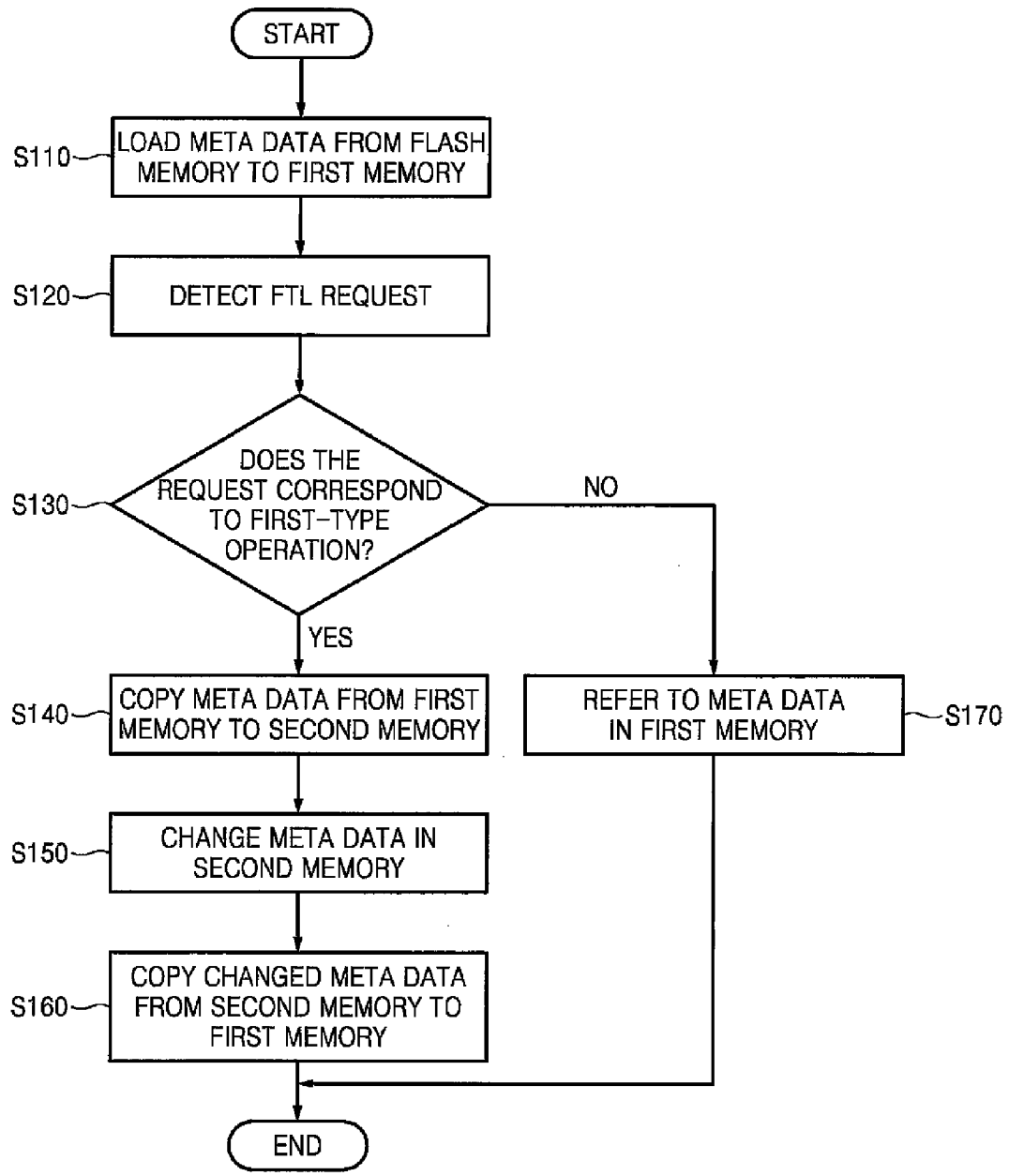
FIG. 5 is a flowchart summarizing a meta data managing method in relation to the embodiment of the inventive concept shown in FIG. 4.

FIG. 4 is a conceptual diagram further explaining a method of managing meta data according to certain embodiments of the inventive concept. FIG. 5 is a flowchart summarizing the meta data managing method of FIG. 4.

Referring to FIGS. 1, 4 and 5, when the flash memory system 10 is powered-on, meta data is loaded from the flash memory 200 to the first memory 120 (S110). At this time, meta data for each flash memory chip in the flash memory 200 may be separately loaded to and stored in the first memory 120. In FIG. 4, "a11" denotes the meta data loaded from the flash memory 200 and stored in the first memory 120.

When an FTL request is generated (S120), it is first determined whether the FTL request corresponds to a first-type operation (S130). When the FTL request is determined to correspond to the first-type operation (S130=YES), the meta data stored in the first memory 120 is copied to the second memory 130 (S140). In FIG. 4, "b11" denotes the meta data stored in the second memory 130 through the copy operation.

The meta data in the second memory 130 is then changed (S150). In FIG. 4, "b12" denotes meta data undergoing a change in the second memory 130 and "b13" denotes the "changed meta data" following the completion of all changes. The changed meta data (b13 in FIG. 4) is then copied back to the first memory 120 for meta-data update in the first memory 120 (S160). In FIG. 4, "a12" denotes the updated meta data in the first memory 120.

However, when the FTL request is determined to correspond to a second-type operation (S130=NO), the meta data stored in the first memory 120 is not copied to the second memory 130, but the second-type operation is performed referring to the meta data stored in the first memory 120 (S170).

As described above, the FTL request may be generated at the request of a host or it may be internally generated without the host's request.

In the above-described meta data managing method, the meta data is differently managed as between different types of operation requests. In the case of a first-type operation directed to the flash memory, the meta data in a first memory is copied to a second memory, which may be a different kind (faster) of memory than the first memory. Thereafter, the meta data may be changed in the second memory. After the meta data is completed with necessary changes, the changes are reflected in the changed meta data stored in the first memory. In the case of the second-type operation, the meta data does not need to be changed. The meta data in the first memory is used for only read operation and is not changed. Meanwhile, when the meta data has been changed as a result of the first-type operation, the changed meta data (i.e., a12 in FIG. 4) may be used for a read operation.

Consequently, since the meta data is differently managed according to a type of operation (i.e., the first- or second-type operation), different types of operations can be performed on the flash memory without interference. When the meta data managing method according to certain embodiments of the inventive concept is applied according to data request patterns of a host and a cache, the read and write speed of a flash memory device may be increased.

Figure 6:
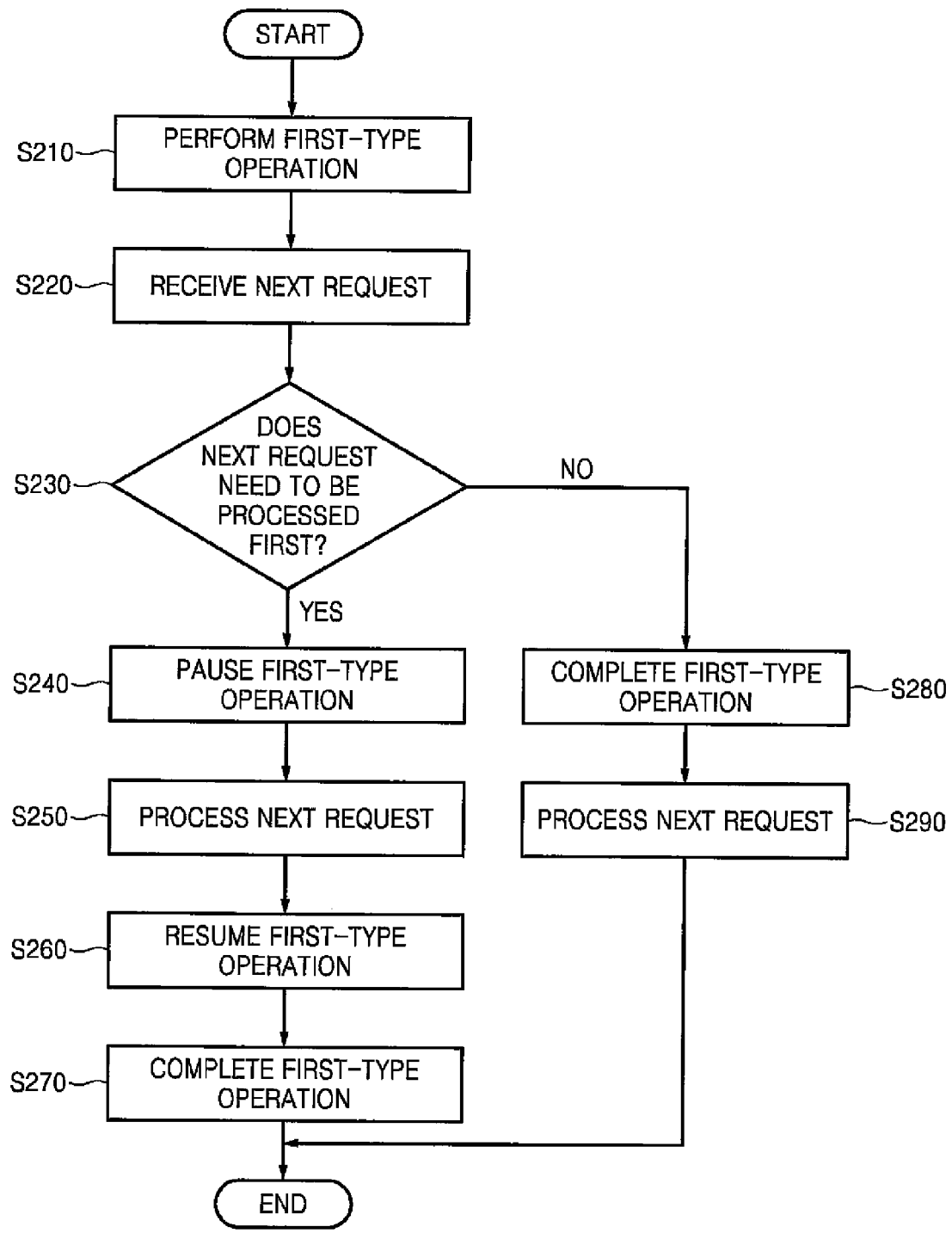
FIG. 6 is a flowchart summarizing a method of managing flash memory according to certain embodiments of the inventive concept.

FIG. 6 is a flowchart summarizing a method of managing a flash memory according to certain embodiments of the inventive concept. FIG. 6 illustrates a method of processing a next host request upon interrupting a current first-type operation. Thus, it is assumed that a first-type operation is being performed (S210) when a next host request is received during the processing of (i.e., the commensurate execution of steps required to perform) the first-type operation (S220).

Upon receiving the next request under this condition, it is determined whether or not the next request must be immediately processed (S230) (i.e., whether the operation implicated by the next request should be processed before completion of the current first-type operation). The memory controller 100 of FIG. 1 may make this determination. If it is determined that the next request must be immediately processed (S230=YES), the current first-type operation is interrupted (or paused) (S240), and the next request is processed as an interrupt (S250). After completing execution of the operation implicated by the next request, the memory controller 100 resumes the first-type operation (S260) until it is completed (S270).

In contrast, when it is determined that the next request does not need to be immediately processed (S230=NO), the memory controller 100 completes the first-type operation (S280), and then processes the next request in sequence (S290).

In the embodiment of FIG. 6, the next request is immediately processed only in the course of currently performing a first-type operation. In certain embodiments of the inventive concept, the interrupting "next operation" implicated by the next request will be a second-type operation, but the inventive concept is not limited to only this type of interrupting next request.

Consequently, according to certain embodiments of the inventive concept, with respect to a next request for a channel associated with a flash memory, said next request being generated while a current operation using the requested channel is being performed, the current operation may be paused, the next operation processed as an interrupt, and then the current operation resumed. Accordingly, a next request such as a read operation may be processed during an internal operation, such as a merge operation, thereby reducing response time by the memory system to a corresponding host request. In addition, since an idle channel may be used, the read/write speed of the flash memory can be increased.

The non-volatile memory 200 and/or the memory controller 100 according to some embodiments of the present inventive concept may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The non-volatile memory system 10 according to certain embodiments of the present inventive concept may take the form of a solid state drive/disk (SSD) or a memory card. The memory controller 100 may be designed to communicate with an external device, e.g., a host, using one of various interface protocols such as universal serial bus (USB), multimedia card (MMC), a peripheral component interconnect express (PCI-E), serial ATA (SATA), parallel ATA (PATA), small computer system interface (SCSI), enhanced small disk interface (ESDI), and integrated drive electronics (IDE).

With the increase of use of mobile devices such as cellular phones, personal digital assistant (PDA) digital cameras, portable game consoles, and MP3 players, the non-volatile memory system 10 can be used as code storages as well as data storages. The non-volatile memory system 10 can also be used in home applications such as high definition televisions (HDTVs), DVDs, routers, and global positioning systems (GPSs).

The non-volatile memory system 10 according to an exemplary embodiment of the present inventive concept may be embedded in the electronic system such as mobile devices, laptop computers, or desktop computers. Some examples of the electronic system are illustrated in FIGS. 7 and 8.

Figure 7:
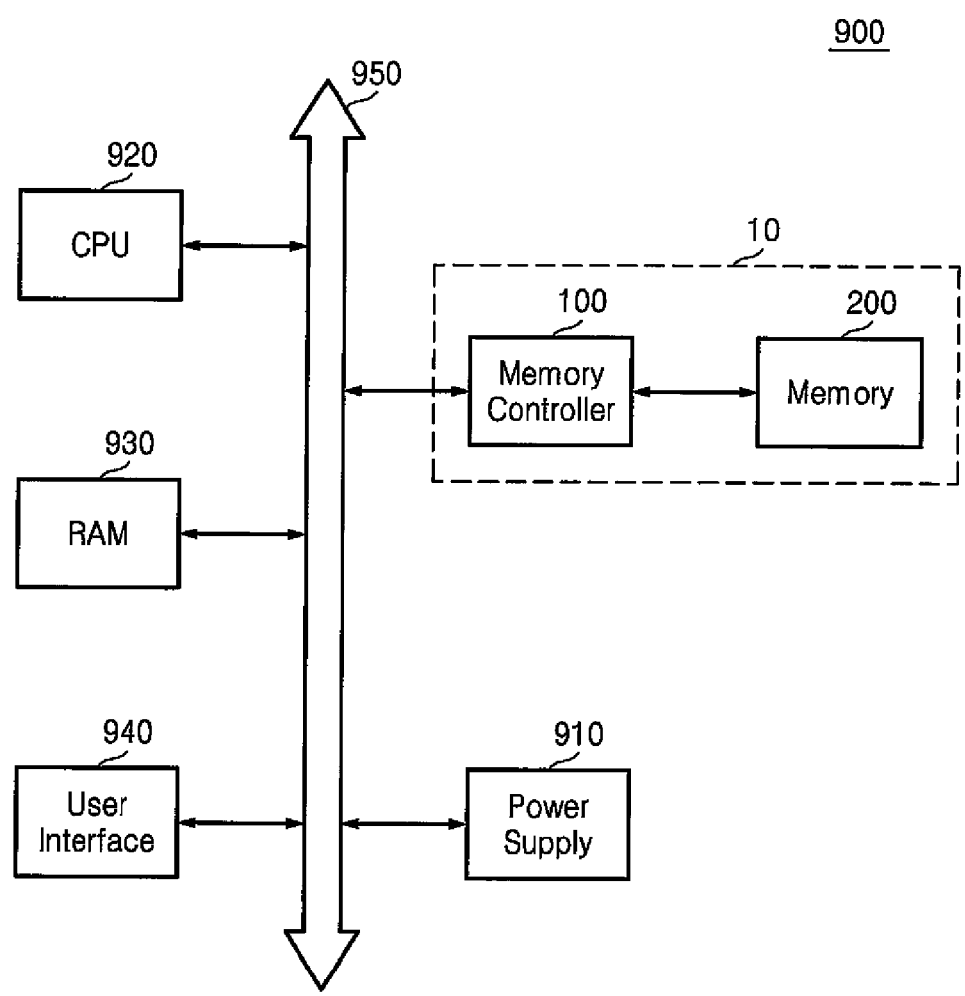
FIG. 7 is a block diagram of an electronic system incorporating a flash memory system according to certain embodiments of the inventive concept.
Figure 8:
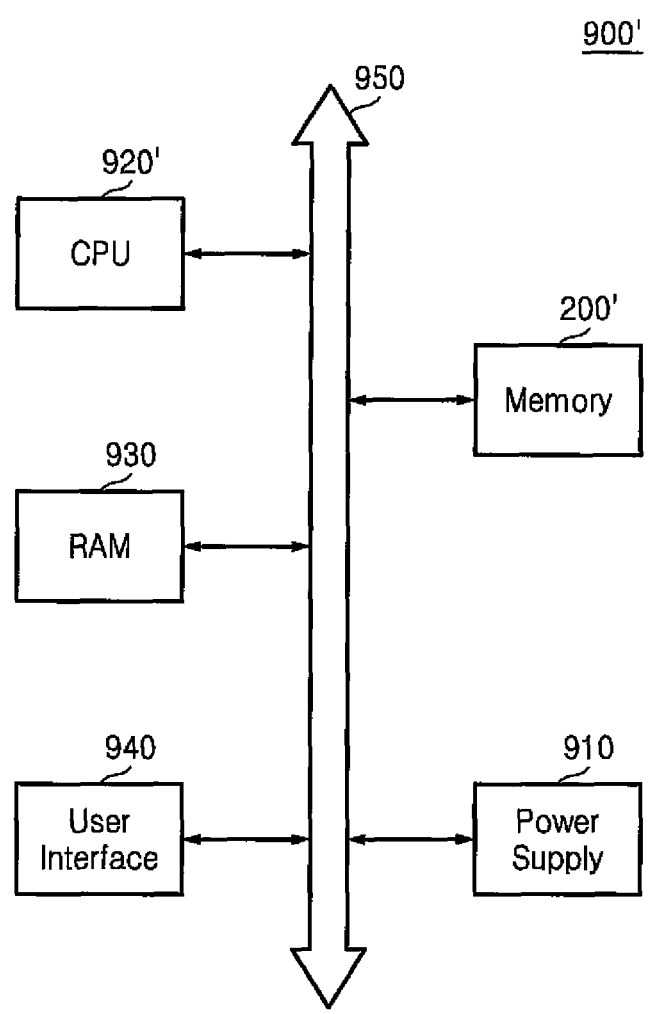
FIG. 8 is a block diagram of another electronic system incorporating a flash memory system according to certain embodiments of the inventive concept.

Referring to FIG. 7, the electronic system 900 according to the present exemplary embodiment may include a nonvolatile memory system 10, a power supply 910, a central processing unit (CPU) 920, a RAM 930, a user interface 940, and a system bus 950 electrically connecting these elements.

The CPU 920 controls the overall operation of the electronic system 900. The RAM 930 stores information needed for the operation of the electronic system 900. The user interface 940 provides an interface between the electronic system 900 and a user. The power supply 910 supplies electric power to the internal constituent elements such as the CPU 920, the RAM 930, the user interface 940, and the nonvolatile memory system 10.

The non-volatile memory system 10 stores the N-bit data, where N is 1 or an integer greater than 1, that is provided through the user interface 940 or processed or will be processed by the CPU 920.

The non-volatile memory system 10 according to an exemplary embodiment of the present inventive concept is as described above. A detailed description thereof will be thus omitted.

Although the non-volatile memory 200 and the memory controller 100 may together constitute a single memory card, the non-volatile memory 200 and the memory controller 100 may be separately embodied. The memory controller and the flash memory may constitute, for example, a solid state drive/disk (SSD) using a non-volatile memory for storing data. The memory controller 100 may be embodied in a host.

FIG. 8 illustrates an electronic system 900' according to another exemplary embodiment of the present inventive concept. In the embodiment illustrated in FIG. 8, a non-volatile memory 200' may functions as main memory of the electronic system 900'. The CPU 920' controls the overall operation of the electronic system 900' and functions as memory controller. For example, the CPU 920' may receive and process data input via the user interface 940 and then transmit the data to the nonvolatile memory 200' via the system bus 950. The nonvolatile memory 200' may store the data input via the system bus 950 into memory cells. The data stored in memory cells are read by the CPU 920' and output via the user interface 940.

Although the nonvolatile memory 200' has similar construction and function as the nonvolatile memory 200 illustrated in FIG. 1, the nonvolatile memory 200' does not interface with the host via a memory controller 100 but directly interfaces with the host. The electronic system 900' illustrated in FIG. 8 may be portable electronic system such as mobile device.

Although it is not illustrated in the drawings, the electronic system 900 or 900' may be further provided with application chipsets, camera image processors (CISs), or mobile DRAMs, which is well known to one skilled in the art to which the present inventive concept pertains.

The present inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. Also, functional programs, codes, and code segments to accomplish the present general inventive concept can be easily construed by programmers skilled in the art to which the present general inventive concept pertains.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A non-volatile memory system comprising:
   a flash memory configured to store payload data and meta data;
   a first memory configured to store meta data loaded from the flash memory;
   a second memory configured to store meta data copied from the first memory; and
   a flash memory controller configured during a first-type operation requiring a change to the meta data to copy the meta data from the first memory to the second memory, change the meta data copied to the second memory, and re-copy the changed meta data from the second memory back to the first memory.

2. The non-volatile memory system of claim 1, wherein the first memory and the second memory are different types of memory.

3. The non-volatile memory system of claim 2, wherein the first memory is dynamic random access memory (DRAM) and the second memory is static random access memory (SRAM).

4. The non-volatile memory system of claim 1, wherein the flash memory controller is further configured to load meta data stored in the flash memory to the first memory when the non-volatile memory system is powered-on, and to re-load the meta data stored in the first memory to the flash memory when the non-volatile memory system is powered-off.

5. The non-volatile memory system of claim 1, wherein the memory controller is further configured to;
   (a) process a current first-type operation,
   (b) during processing of the current first-type operation, receive a next request implicating a next operation;
   (c) determine whether the next operation requires immediate processing, and
   (d) if the next operation requires immediate processing, pause the current first-type operation, process the next operation as an interrupt, and then upon completion of the next operation resuming the current first-type operation.

6. The non-volatile memory system of claim 5, wherein the next operation is a second-type operation not requiring a change to the meta data.

7. The non-volatile memory system of claim 6, wherein the first-type operation is one selected from the group consisting of a write operation, a merge operation, and a wear-leveling operation, and
   the second-type operation is a read operation.

8. The non-volatile memory system of claim 5, wherein the memory controller upon determining that the next operation does not require immediate processing is further configured to;
   (e) continue processing of the first-type operation until completed, and then
   (f) process the next operation.

9. The non-volatile memory system of claim 1, wherein the first-type operation is one selected from the group consisting of a write operation, a merge operation, and a wear-leveling operation.

10. The non-volatile memory system of claim 1, wherein the meta data comprises a mapping table mapping a physical block storing data in the flash memory with a corresponding logical block.

11. An electronic system comprising:
    the non-volatile memory system of claim 1; and
    a host configured to communicate with the non-volatile memory system.

12. A method of managing a flash memory in a memory system including the flash memory and a memory controller controlling the flash memory, the method comprising:
    loading meta data stored in the flash memory to a first memory upon power-on of the memory system; and
    during processing of a first-type operation requiring a change to the meta data,
      (a) copying the meta data from the first memory to a second memory,
      (b) changing the meta data stored in the second memory, and
      (c) copying the changed meta data from the second memory back to the first memory.

13. The method of claim 12, wherein the second memory is a different type of memory from the first memory, such that the second memory operates faster than the first memory.

14. The method of claim 13, wherein the first memory is dynamic random access memory (DRAM) and the second memory is static random access memory (SRAM).

15. The method of claim 13, further comprising:
    during the processing of the first-type operation, receiving a request to process a second-type operation not requiring a change to the meta data and
    pausing the processing of the first-type operation, processing the second-type operation as an interrupt to completion, and then resuming processing of the first-type operation.

16. The method of claim 13, further comprising:
    loading the meta data stored in the first memory to the flash memory when the memory system is powered-off.

* * * * *